(12) United States Patent
Gohel et al.

(10) Patent No.: US 8,310,270 B2
(45) Date of Patent: Nov. 13, 2012

(54) EMULATING BEHAVIOR OF A LEGACY TEST SYSTEM

(75) Inventors: Tushar K. Gohel, Wakefield, MA (US); Lloyd K. Frick, Pepperell, MA (US)

(73) Assignee: Teradyne, Inc., North Reading, MA (US)

( * ) Notice: Subject to any disclaimer, the term of this patent is extended or adjusted under 35 U.S.C. 154(b) by 1352 days.

(21) Appl. No.: 11/867,672

(22) Filed: Oct. 4, 2007

(65) Prior Publication Data

US 2009/0091347 A1  Apr. 9, 2009

(51) Int. Cl.
*G01R 31/40* (2006.01)
(52) U.S. Cl. ............... 324/764.01; 324/762.01
(58) Field of Classification Search ............ 324/764.01, 324/762.01
See application file for complete search history.

(56) References Cited

U.S. PATENT DOCUMENTS

| | | | |
|---|---|---|---|
| 5,929,628 A | 7/1999 | Becker et al. | |
| 6,498,473 B1 | 12/2002 | Yamabe | |
| 7,199,604 B2 | 4/2007 | Hecht et al. | |
| 8,013,668 B1 * | 9/2011 | Li | 327/540 |
| 2006/0123301 A1 | 6/2006 | Wey et al. | |
| 2006/0132166 A1 * | 6/2006 | Walker et al. | 324/765 |
| 2008/0016396 A1 * | 1/2008 | Higashi et al. | 714/30 |

OTHER PUBLICATIONS

Tushar Gohel, "Stable, Repeatable, and Adaptable Digital Testing in a Varying Interconnect Environment," *IEEE*, pp. 503-509 (2005).
International Search Report and Written Opinion from International application No. PCT/US2008/078715 dated Dec. 30, 2008.
International Preliminary Report (inc. Written Opinion) on Patentability in Application No. PCT/US2008/078715, dated Apr. 7, 2010.
Office Action issued Apr. 13, 2012 in corresponding Chinese Patent Application No. 200880110371 asserting claims 1-25 lack novelty over US20060132166A1 (previously cited in U.S. Appl. No. 11/867,672 in an IDS on Jan. 26, 2009).

* cited by examiner

*Primary Examiner* — Arleen M Vazquez
(74) *Attorney, Agent, or Firm* — Fish & Richardson P.C.

(57) ABSTRACT

An apparatus for use in testing a device includes a communication channel having a set of programmable parameters associated therewith. The programmable parameters result in a bias condition on the communication channel. A bias control circuit is used to affect the bias condition that results from the programmable parameters in order to emulate a desired bias condition.

21 Claims, 5 Drawing Sheets

# EMULATING BEHAVIOR OF A LEGACY TEST SYSTEM

TECHNICAL FIELD

This patent application relates generally to emulating behavior of a legacy test system.

BACKGROUND

Automatic test equipment (ATE) plays a role in the manufacture of semiconductor devices and circuit board assemblies. Manufacturers generally use automatic test equipment, or "testers," to verify the operation of devices during the manufacturing process. Such devices are referred to as a "device under test" (DUT) or a "unit under test" (UUT). Early detection of faults eliminates costs that would otherwise be incurred by processing defective devices, and thus reduces the overall costs of manufacturing. Manufacturers also use ATE to grade various specifications. Devices can be tested and binned according to different levels of performance in areas, such as speed. Devices can be labeled and sold according to their actual levels of performance.

Test programs have been developed for what is referred to herein as "legacy", or pre-existing, ATE. Some test programs have been developed to account for signals that appear on inactive communication channels of the ATE. An inactive communication channel may include a communication channel in which a driver, a detector, an active load, and/or PMU have been turned off or have been otherwise made inactive. Although inactive, some communication channels can still register signal levels at ATE detectors. This may be due, e.g., to leakage current from the ATE's driver or some other unintended signals. Different types of legacy ATE typically exhibit consistent signal levels for inactive channels. Test programs have therefore been developed to expect such signals and to take these expected signals into account during testing. For such test programs, failure to register an expected signal from an inactive communication channel can result in an indication that a DUT has failed the test when, in fact, the failure indication is merely a result of an unexpected signal on an inactive communication channel.

In recent years, many types of legacy ATEs have been replaced with newer, higher-performance ATEs. Although such newer testers have many new features, many of the test programs that run on these newer testers have already been written, and depend on the performance characteristics of the legacy ATEs. For example, a test program may rely on expected bias conditions of a communication channel when its driver and active load are disabled (e.g., then the communication channel is inactive). However, a newer ATE may not necessarily have the same performance characteristics as the legacy ATE. This can affect how existing test programs are used with newer, or successor, ATE.

SUMMARY

This patent application describes methods and apparatus, including circuitry, for emulating behavior of a legacy test system.

Described herein is a system and apparatus for use in testing a device that includes a communication channel having a set of programmable parameters associated therewith. The programmable parameters result in a bias condition on the communication channel. A bias control circuit is used to affect the bias condition that results from the programmable parameters in order to emulate a desired bias condition. Other aspects, features, and implementations are also described.

The details of one or more examples are set forth in the accompanying drawings and the description below. Further features, aspects, and advantages will become apparent from the description, the drawings, and the claims.

DETAILED DESCRIPTION

Like reference numerals in different figures indicate like elements.

DETAILED DESCRIPTION

Figure 1:
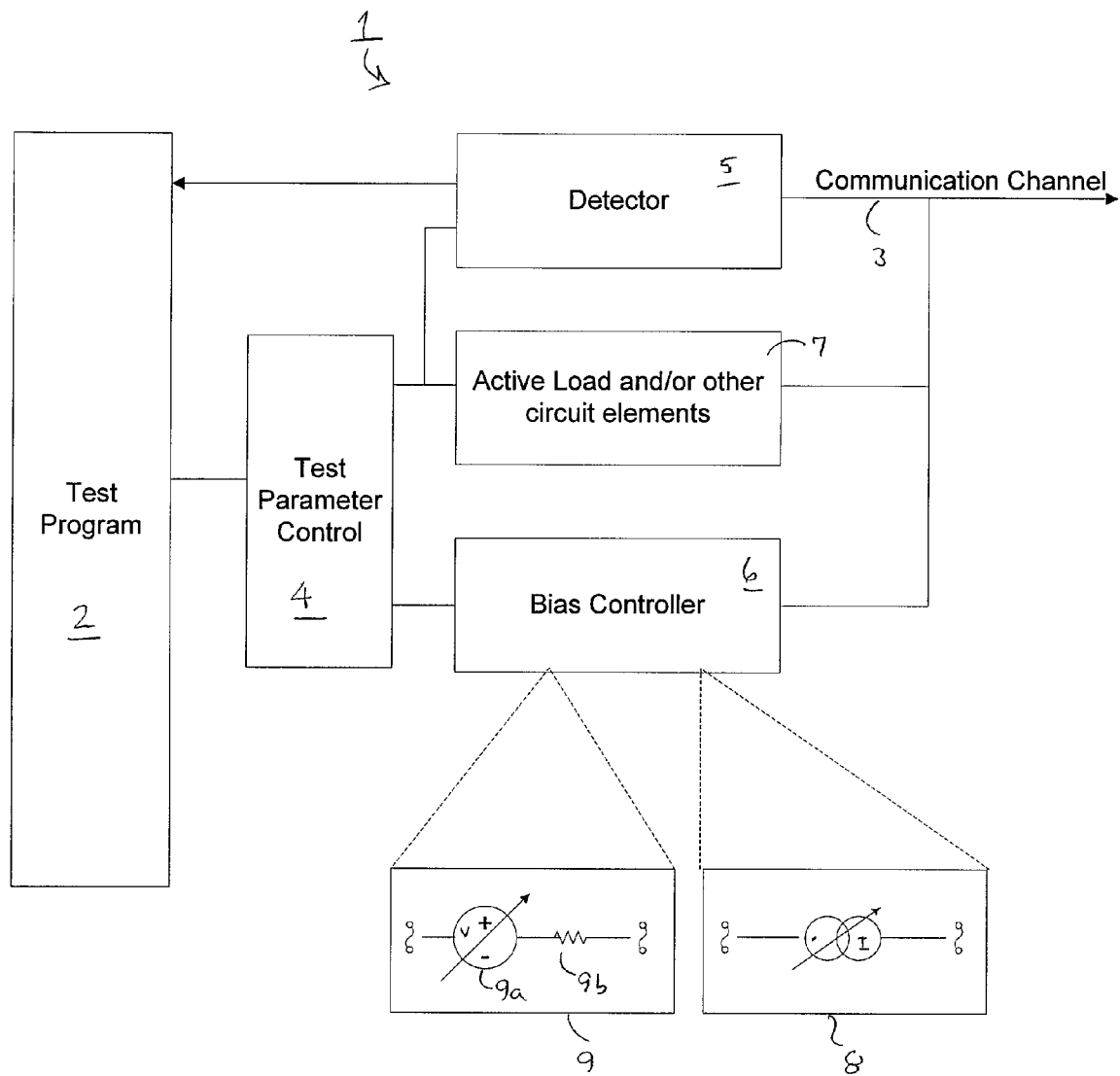
FIG. 1 is a block diagram of ATE components that may be used to produce a bias condition on a communication channel that emulates a desired bias condition.

FIG. 1 shows a block diagram of components that may be part of an ATE 1. ATE 1 may be a successor to legacy ATE, such as a newer model of existing ATE or a completely new model of ATE. These components may be used in ATE 1 to emulate the bias conditions of legacy ATE, or any other desired bias conditions. The bias conditions may include a bias current, which may be, or include, a leakage current. The bias conditions may include a bias voltage, which may be, or include, an offset (e.g., non-zero) voltage. Test program 2 may be designed for use with legacy ATE (not shown). In ATE 1, test program 2 is used to perform tests on signals received from a DUT (not shown) over communication channel 3. A control block 4, which may be executed through a combination of software, firmware, and or hardware, controls the programming of test parameters on ATE 1. These test parameters may include, but are not limited to, test thresholds for detector 5 (e.g., high or $V_{OH}$ levels, and low or $V_{OL}$ levels), parameters to control the voltage and/or current output of an active load(s), and/or parameters to implement other functions for the other circuit elements 7.

The values of the test parameters affect the bias condition on the communication channel. That is, different values for the test parameters can produce different bias conditions. In one example, bias conditions produced by specific values for these parameters on a legacy ATE communication channel are compared to bias conditions produced for the same parameter values on successor (e.g., more modern) ATE. A bias controller 6 (described below) affects the bias condition(s) on the communication channel so that bias condition(s) for the successor ATE matches that of the legacy ATE.

During operation of ATE 1, test signals may be output from ATE 1 to the DUT over communication channel 3. The DUT responds by providing response signals over communication channel 3. The response signals may be, e.g., produced by the DUT in response to the test signals provided by ATE. Alternatively, signals may be provided from the DUT to communication channel 3 that are independent of the test signals. Alternatively, the DUT may be disconnected from the channel all together, while the test program may expect the channel to sustain bias conditions consistently for the system test to pass. In any case, detectors, such as detector 5, may receive the signals. There may be one detector per channel (only one channel is shown in FIG. 1).

Detector 5 may include one or more comparators and/or other types of hardware to implement a measurement function. At least part of detector 5 may also be implemented in software. Detector 5 is electrically connected to communication channel 3, and is configured to receive signals from the communication channel, to compare those signals to one or more thresholds, and to provide comparison results to test program 2. There, the comparison results are evaluated in order to determine, e.g., if the DUT has passed for failed a particular test. It is noted that electrical connection, when used herein, does not require a direct physical connection. An electrical connection may include intervening components between two components. Likewise, electrical connection may include non-wired electrical connections, such as those produced by a transformer.

Other circuitry 7, which may include active and/or passive loads, may also be electrically connected to communication channel 3. This other circuitry may be used, e.g., to provide one or more loading condition(s) to communication channel 3. The loading condition(s) may include, but are not limited to, desired voltage and/or current to the communication channel 3.

ATE 1 also includes bias controller 6. Bias controller 6 may be used to emulate, on communication channel 3, a desired bias condition, such as the bias condition of a communication channel of legacy ATE. Bias controller 6 may include a programmable, bidirectional (source or sink), bias current source 8, although other types of signal sources—both programmable and non-programmable—may be used in lieu of current source 8. The current output by current source 8 in conjunction with currents and impedances already on the communication channel 3 affects the existing bias condition on the communication channel to produces a new bias condition (e.g., voltage) on the communication channel. For example, the output current may alter the voltage on the communication channel so that it is equivalent to a bias voltage that would be expected from a legacy ATE on the same communication channel.

Bias controller 6 may include a voltage source/impedance circuit 9, which may include a voltage source 9a in combination with an impedance circuit 9b. Voltage source 9a may, or may not, be programmable. Impedance circuit 9b may be a resistor, a resistive network, a variable resistor, a capacitive element, an inductive element, a transistor, and/or combinations of one of more of these or other elements. In operation, this circuit passes current to/from communication channel 3, thereby producing a voltage across the impedance circuit 9b. This voltage, when combined with the voltage from source 9a and bias condition(s) of communication channel 3 produces a bias condition (e.g., voltage) that emulates the bias conditions that legacy ATE would produce on communication channel 3.

Bias controller 6 may include a combination of programmable bias current source 8 and voltage source/impedance circuit 9. An example of a circuit that includes both of these elements is described below with respect to FIG. 4. It is noted that bias controller 6 should have a sufficient programmable range to compensate for bias differences between legacy ATE being emulated and successor ATE.

As described above, a test program designed for legacy ATE may expect a certain voltage on an inactive communication channel (e.g., a communication channel that is disabled or tri-stated). Some test programs may expect certain current or other signal levels on the communication channel; however, the following describes an example in which a certain voltage is expected. This voltage is detected via detector 5 and passed to a processing device (e.g., a computer) executing test program 2.

In operation, bias controller 6 may be controlled (e.g., programmed) to provide a signal (e.g., a current) to an inactive communication channel 3, which results in a bias condition (e.g., current and/or voltage signals) on the inactive communication channel 3 that is the same as, or substantially the same as, the bias condition that would be present on the inactive communication channel of the legacy ATE. Test program 2 expects the bias condition, e.g., the current and/or voltage signals from legacy ATE for which test program 2 was designed. As a result of bias controller 6 emulating the performance of the legacy ATE on inactive communication channel 3, test program 2 will receive the signals that it expects to receive on inactive communication channel 3 and, as a result, test program 2 can be used on non-legacy, e.g., successor or modern, ATE 1.

Figure 2:
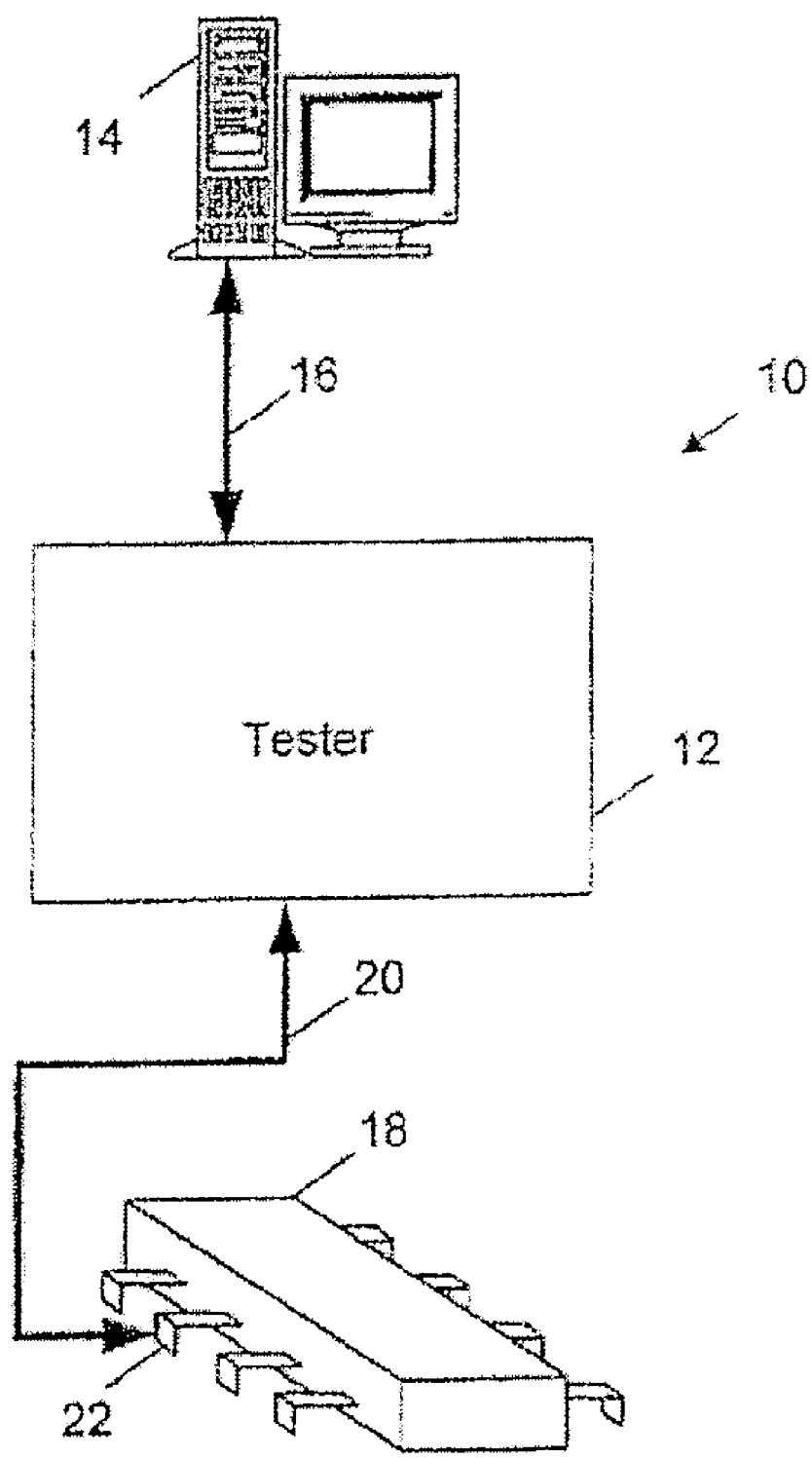
FIG. 2 is a block diagram of ATE for testing devices.

Referring now to FIG. 2, that figure shows an example of a system on which the foregoing bias condition emulation process may be implemented. FIG. 2 shows an ATE system 10 for testing a device-under-test (DUT) 18, such as a semiconductor device, which includes a tester 12. To control tester 12, system 10 includes a computer system 14 that interfaces with tester 12 over a hardwire connection 16. Typically, computer system 14 sends commands to tester 12 to initiate execution of routines and functions for testing DUT 18. Such executing test routines may initiate the generation and transmission of test signals to the DUT 18 and collect responses from the DUT. Various types of DUTs may be tested by system 10. For example, DUTs may be semiconductor devices such as an integrated circuit (IC) chip (e.g., memory chip, microprocessor, analog-to-digital converter, digital-to-analog converter, etc.).

To provide test signals and collect responses from the DUT, tester 12 is connected to one or more connector pins that provide an interface for the internal circuitry of DUT 18. To test some DUTs, e.g., as many as sixty-four or one hundred twenty-eight connector pins (or more) may be interfaced to tester 12. For illustrative purposes, in this example, semiconductor device tester 12 is connected to one connector pin of DUT 18 via a hardwire connection. A conductor 20 (e.g., cable) is connected to pin 22 and is used to deliver test signals (e.g., PMU test signals, PE test signals, etc.) to the internal circuitry of DUT 18. Conductor 20 also senses signals at pin 22 in response to the test signals provided by semiconductor device tester 12. For example, a voltage signal or a current signal may be sensed at pin 22 in response to a test signal and sent over conductor 20 to tester 12 for analysis. Such single port tests may also be performed on other pins included in DUT 18. For example, tester 12 may provide test signals to other pins and collect associated signals reflected back over conductors (that deliver the provided signals). By collecting the reflected signals, the input impedance of the pins may be characterized along with other single port testing quantities. In other test scenarios, a digital signal may be sent over conductor 20 to pin 22 for storing a digital value on DUT 18. Once stored, DUT 18 may be accessed to retrieve and send the stored digital value over conductor 20 to tester 12. The retrieved digital value may then be identified to determine if the proper value was stored on DUT 18.

Along with performing one-port measurements, a two-port test may also be performed by semiconductor device tester 12. For example, a test signal may be injected over conductor 20 into pin 22 and a response signal may be collected from one or more other pins of DUT 18. This response signal is provided to semiconductor device tester 12 to determine quantities, such as gain response, phase response, and other throughput measurement quantities.

Figure 3:
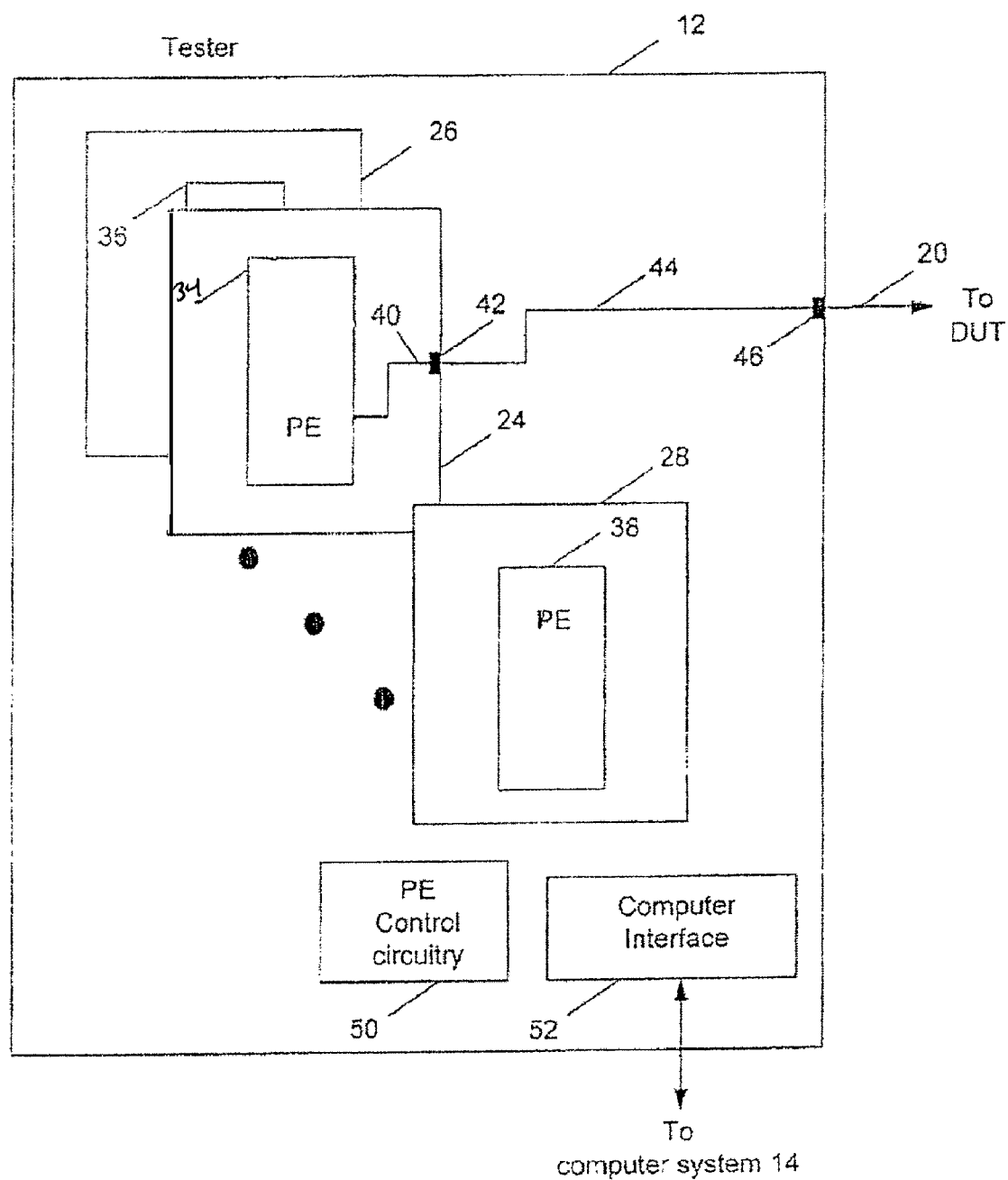
FIG. 3 is a block diagram of a tester used in the ATE.

Referring also to FIG. 3, to send and collect test signals from multiple connector pins of a DUT (or multiple DUTs), semiconductor device tester 12 includes an interface card 24 that can communicate with numerous pins. For example, interface card 24 may transmit test signals to, e.g., 32, 64, or 128 pins and collect corresponding responses. Each communication link to a pin comprises a channel and, by providing test signals to a large number of channels, testing time is reduced since multiple tests may be performed simultaneously. Along with having many channels on an interface card, by including multiple interface cards in tester 12, the overall number of channels increases, thereby further reducing testing time. In this example, two additional interface cards 26 and 28 are shown to demonstrate that multiple interface cards may populate tester 12.

Each interface card includes a dedicated integrated circuit (IC) chip (e.g., an application specific integrated circuit (ASIC)) for performing particular test functions. For example, interface card 24 includes a pin electronics (PE) stage 34 that includes circuitry for performing PE tests. PE stage 34 also may include circuitry for performing parametric measurement unit (PMU) tests. Additionally, interface cards 26 and 28 respectively include PE stages 36 and 38 that comprise PE circuitry. Typically PMU testing involves providing a (programmable) DC voltage or current signal to the DUT to determine such quantities as input and output impedance, current leakage, and other types of DC performance characterizations. PE testing involves sending DC or AC test signals, or waveforms, to a DUT (e.g., DUT 18) and collecting responses to further characterize the performance of the DUT. For example, PE stage 34 may transmit (to the DUT) AC test signals that represent a vector of binary values for storage on the DUT. Once these binary values have been stored, the DUT may be accessed by tester 12 to determine if the correct binary values have been stored.

To pass both DC and AC test signals from interface card 24 to DUT 18 (FIG. 2), a conducting trace 40 connects PE stage 34 to an interface board connector 42 that allows signals to be passed on and off interface board 24. Interface board connector 42 is also connected to a conductor 44 that is connected to an interface connector 46, which allows signals to be passed to and from tester 12. In this example, conductor 20 is connected to interface connector 46 for bidirectional signal passage between tester 12 and pin 22 of DUT 18. In some arrangements, an interface device may be used to connect one or more conductors from tester 12 to the DUT. For example, the DUT may connect to an Interface Test Adapter (ITA) which interfaces with an Interface Connection Adapter (ICA) that connects with the tester. The DUT (e.g., DUT 18) may be mounted onto a device interface board (DIB) for providing access to each DUT pin. In such an arrangement, conductor 20 may be connected to the DIB for placing test signals on the appropriate pin(s) (e.g., pin 22) of the DUT.

In this example, only conducting trace 40 and conductor 44 respectively connect PE stage 34 and interface board 24 for delivering and collecting signals. However, PE stage 34 (along with PE stages 36 and 38) typically has multiple pins (e.g., eight, sixteen, etc.) that are respectively connected with multiple conducting traces and corresponding conductors for providing and collecting signals from the DUT (via a DIB). Additionally, in some arrangements, tester 12 may connect to two or more DIBs for interfacing the channels provided by interface cards 24, 26, and 28 to one or multiple devices under test.

To initiate and control the testing performed by interface cards 24, 26, and 28, tester 12 includes PE control circuitry 50 that provide test parameters (e.g., test signal voltage level, test signal current level, digital values, etc.) for producing test signals and analyzing DUT responses. The PE control circuitry may be implemented using one or more processing devices. Examples of processing devices include, but are not limited to, a microprocessor, a microcontroller, programmable logic (e.g., a field-programmable gate array), and/or combination(s) thereof.

Tester 12 also includes a computer interface 52 that allows computer system 14 to control the operations executed by tester 12 and also allows data (e.g., test parameters, DUT responses, etc.) to pass between tester 12 and computer system 14.

Computer 14, or another processing device used on or associated with ATE 10, may be configured to execute a test program to test a DUT on active communication channels with the ATE. The test program may be configured to expect a certain voltage on one or more inactive communication channels. Accordingly, ATE 10 includes hardware (e.g., circuitry) and/or software to generate the expected bias conditions on the inactive communication channel(s). Any type of circuitry may be used to perform this function including, but not limited to, one or more PMUs.

Figure 4:
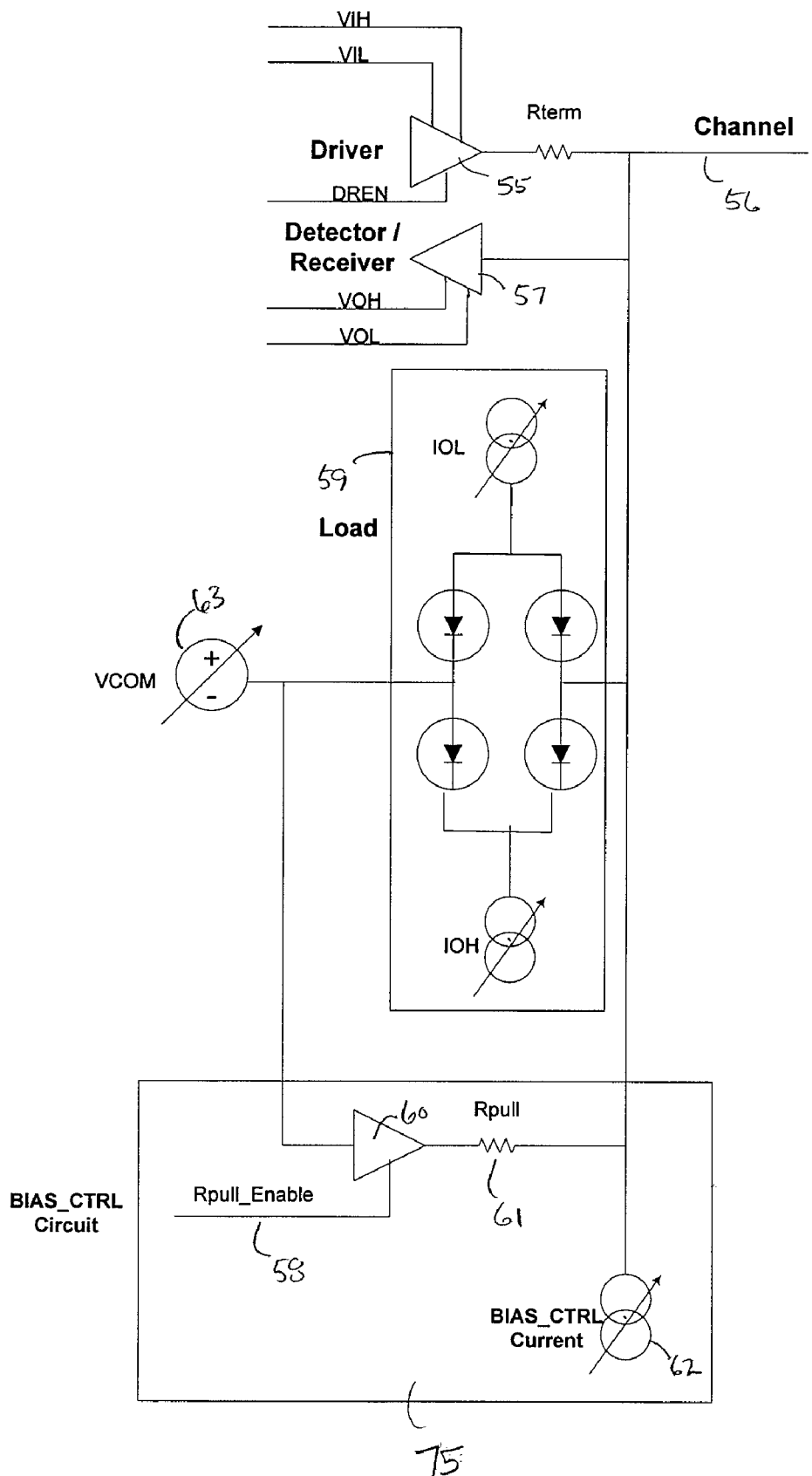
FIG. 4 is a diagram of circuitry that may be used to emulate the behavior of legacy ATE on an inactive communication channel between the ATE and a DUT.

An example of a circuit that may be used to emulate the bias conditions of legacy ATE, which may be incorporated into ATE system 10, is shown in FIG. 4. For example, the circuit may be part of the pin electronics or the interface cards described above.

Referring to FIG. 4, ATE 10 includes a driver 55 to output test signals to a DUT, such as DUT 18, over communication channel 56, and a detector (or receiver) 57 to receive signals from the DUT over communication channel 56. Detector 57 may include one or more comparators and/or other type of detection circuitry. The received signals may be output results produced by the DUT in response to the test signals provided by driver 55 or they may be signals that are provided by the DUT independently of the signals provided by driver 55. Load 59 may be an active load that subjects communication channel 56 to a loading condition. In this example, load 59 is controllable (e.g., programmable) to provide one of plural load conditions to the communication channel. The active load currents may be controlled by programming $I_{OH}$ and $I_{OL}$ current values. A commutating voltage ($V_{COM}$) may be programmable and provides a voltage for the current sources $I_{OL}$ and $I_{OH}$ to pull the channel 56 to a particular voltage. Other loads that may be used may not be programmable.

A buffer 60 may be used to provide a load resistance from voltage source 63 ($V_{COM}$) to communication channel 56. In one implementation, the input of buffer 60 may be independent of $V_{COM}$. An enable signal 58 ($R_{pull\_Enable}$) controls passage of the voltage, e.g., $V_{COM}$, through buffer 60. The enable signal may be output by PE control circuitry 50, and set by a processing device, such as computer 14. A circuit element 61 may be electrically connected between load 59 and communication channel 56. In this example, circuit element 61 is a resistive element (e.g., a resistor—$R_{pull}$); however, other type(s) of circuit elements may be used in place of, or in addition to, a resistor. Examples of circuit elements that may be used are described above with respect to FIG. 1. Multiple instances of buffer 60 and Rpull with one or more inputs may also be electrically connected to channel 56 to implement the functions described herein.

A signal source 62 (labeled BIAS_CTRL Current in FIG. 4) is electrically connected to communication channel 56. As was the case in the example described above with respect to FIG. 1, signal source 62 is a programmable, bidirectional (source or sink), bias current source, although other types of signal sources—both programmable and non-programmable—may be used in lieu of signal source 62. In this example, signal source 62 may source or sink up to 200 microamperes (μA) to or from the communication channel. A processing device associated with ATE 10, such as computer 14, may be used to program signal source 62 to generate an amount of current needed to obtain a certain current and voltage on the communication channel 56, as described below. The processing device may reference a memory storing parameters, such as high and low threshold voltages and an active load voltage, to determine programming for signal source 62.

The foregoing circuit elements 60, 61, 62 are part of a bias control circuit 75 (labeled BIAS_CTRL Circuit in FIG. 4), which may be configured to perform substantially the same functions as bias controller 6 of FIG. 1, as described.

As described above, a test program designed for legacy ATE may expect a certain voltage on an inactive communication channel (e.g., a communication channel that has its sourcing elements tri-stated or disabled). Some test programs may expect certain current or other signal levels on the communication channel; however, the following describes an example in which a voltage is expected. This voltage is detected via detector 57 and passed to a processing device (e.g., computer 14) executing the test program. In this example, detector 57 may include a high detection threshold $V_{OH}$ and a low detection threshold $V_{OL}$, both of which are programmable to detect high and low signal levels on the communication channel. The voltage that may be expected may be between $V_{OH}$ and $V_{OL}$, although other threshold voltages may be used.

To enable the test program for use with ATE that does not have the same performance characteristics as legacy ATEs, signal source 62 may be controlled (e.g., programmed) to provide a signal (e.g., a current) to an inactive communication channel 56, and $R_{pull}$ 61 may be activated by enabling the buffer 60 to result in a current, voltage, and/or impedance for signals on the inactive communication channel that are substantially the same as those that would be present on the inactive communication channel of the legacy ATE. By simulating the bias conditions of the legacy ATE in this manner, test programs designed for the legacy ATE can be used on ATE that do not have the same performance characteristics.

As shown in FIG. 4, when driver 55 and load 59 are inactive (e.g., off or disabled), detector 57 is still configured to detect a signal on communication channel 56. Furthermore, the DUT may be measuring the signal on the communication channel as well. If the DUT drives the communication channel with a weak source or no source, then the inactive state behavior of driver 55 and the active load 59, along with the input characteristics of detector 57 (and any other detector(s) electrically connected to the communication channel) will dictate the bias conditions—e.g., voltage—on communication channel 56 when communication channel 56 is inactive.

By way of example, when driver 55 is disabled, leakage current still passes through driver 55 to communication channel 56. Leakage current may also be produced via the detector and/or other circuit elements electrically connected the communication channel including signal source 62. High and low thresholds of the driver and detector may influence the amount of leakage current produced by these elements. This leakage current, along with other currents on communication channel 56 flows through the impedance on the communication channel 56 and produces a voltage on communication channel 56. The impedance on the communication channel is the parallel combination of the off state impedance of the elements (e.g. driver, active load) and $R_{pull}$ if buffer 60 is enabled. In order to simulate the voltage of a legacy ATE system, signal source 62 may be programmed to produce a bias current through the impedance on the channel 56 that, when combined with this current already on communication channel 56, produces a voltage on communication channel 56 that is substantially the same as the voltage on communication channel 56 that would have been produced by legacy ATE. This voltage will be detected by detector 57, and processed by the test program. Since the voltage on the inactive communication channel will be what is expected by the test program, the test results produced by the test program will not be adversely affected for the successor, non-legacy ATE.

In this example, to produce the desired voltage on communication channel 56, signal source 62 is programmed to produce a bias current. This bias current combines with (e.g., augments) the current already on the communication channel (e.g., the leakage current). Enable signal 58 is set to allow passage of the voltage to the output of buffer 60 and to cause circuit element ($R_{pull}$) 61, here a resistor, to affect the impedance on the line while pulling the voltage on the channel towards $V_{COM}$. The bias/leakage currents caused by the elements on channel 56 create a voltage across $R_{pull}$ to form a voltage on the channel relative to $V_{COM}$. If signal source 62 is programmed properly, the voltage that is produced on the communication channel corresponds to the voltage that would be present on an inactive communication channel of a legacy ATE. Detector 57 detects this voltage, and passes it along a path to a processing device for use by the test program.

In one example, the commutating voltage ($V_{COM}$) is programmed to 2 volts (V), the resistor $R_{pull}$ has a value of 230 KΩ, and the signal source can produce a programmable current of between −40 micro-amperes (μA) and 40 μA. It is noted, however, that these values are simply examples, and that any values may be used.

Figure 5:
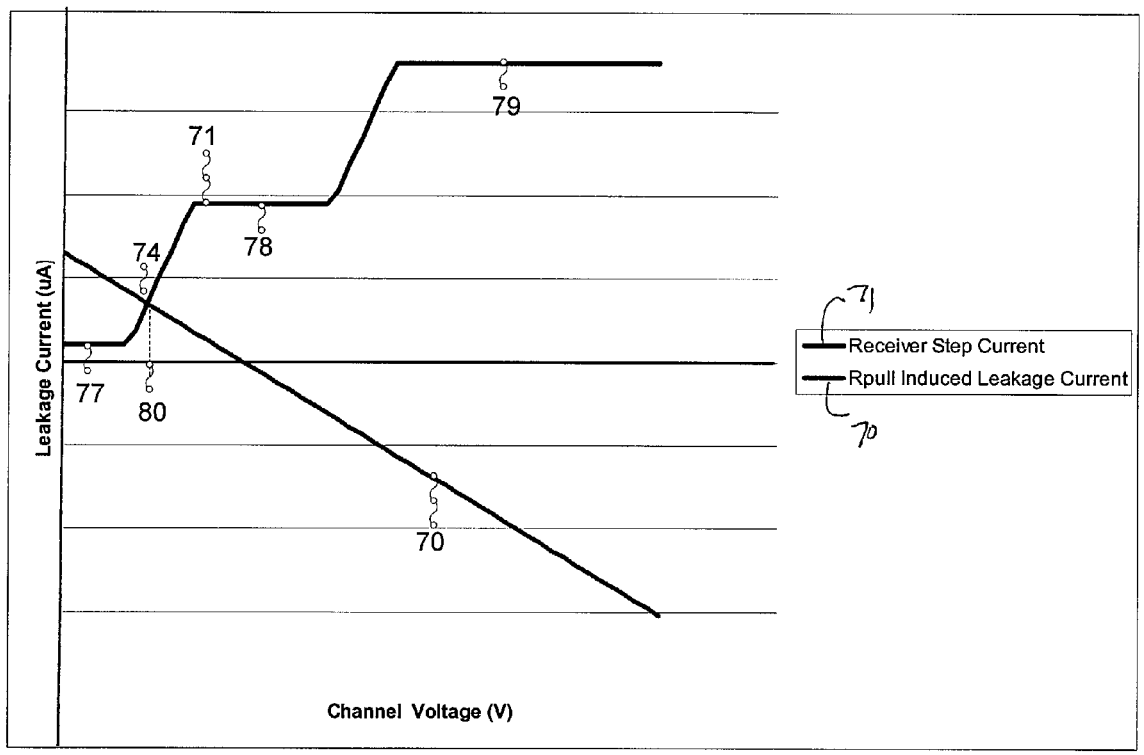
FIG. 5 shows an example of a graph used to determine the bias voltage of the inactive communication channel for a set of programmable parameters.

FIG. 5 shows a graphical example for determining bias conditions based on a set of parameters for an example device/instrument. In FIG. 5, curve 70 shows the leakage current contribution produced across circuit element $R_{pull}$ 61 for a particular set of programmable parameters of an example legacy ATE. The characteristics of curve 70—which is a line in this example—are determined based on values for $R_{pull}$, $V_{COM}$, and the channel voltage. For curve 70, $V_{COM}$ determines its X-axis intercept, and $R_{pull}$ determines its slope.

Curve 71 shows the leakage current contribution of the detector 57 on the example legacy ATE's communication channel for the same set of programmable parameters used to produce curve 70. Referring to FIG. 5, step 77 corresponds to the quiescent leakage current on the communication channel. The X-axis locations of steps 78 and 79 are based on the values for threshold voltages $V_{OH}$ and $V_{OL}$. The transition from step 77 to 78 occurs when crossing one of the two threshold voltages $V_{OH}$ or $V_{OL}$ and the transition from step 78 to 79 occurs when crossing the other threshold $V_{OH}$ or $V_{OL}$. In the examples shown in FIG. 5, the threshold voltages are about in the middle of the slope of each step. The magnitude of the currents at the steps are based on properties of the detector 57.

The intersection of the two curves 70 and 71, namely point 74, corresponds to the bias voltage 80 that would appear on the example legacy ATE and that the new (modern) ATE must achieve for compatibility. The new ATE may achieve this bias voltage 80 via bias control circuit 75, as described above. In one example, straight line 70 represents the current going through Rpull 61 into channel 56. Curve 71 represents the leakage current (step current) going into detector 57 for a set of thresholds. Intersection point 74 corresponds to the point where those two currents cancel (e.g., are equal in magnitude and opposite in direction), which is designated the equilibrium point. At this point, the voltage on communication channel 56 floats to the voltage 80 at the equilibrium point. This is the voltage bias of the legacy tester that may be achieved in the modern tester through elements of bias control circuit 75. Different programmable parameters, e.g., $V_{OH}$, $V_{OL}$, $V_{COM}$, will produce corresponding, but different, curves for 70 and 71 and, thus, a different intersection point. Bias control circuit 75 may be controlled to obtain different voltages, as described above.

To summarize, the current through $R_{pull}$ results from $V_{COM}$ and the channel voltage. The voltage 80 at the equilibrium point is the voltage to which the communication channel floats when the currents are at equilibrium (intersection point 74). This point is the "unknown", which the graph helps to solve for, in order to determine what bias condition needs to be achieved in the "modern" ATE (and, thus, how to program the bias current).

A similar graphing technique to the one shown in FIG. 4 may be used to determine the relationship between programmable parameters of modern ATE and the equilibrium point 80. These programmable parameters include the programmable parameters associated with the bias control circuit 75 (FIG. 4). This graph may be generated using the same programmable parameters associated with the elements on the communication channel of the modern ATE. The graph may have curves associated with the same elements as the legacy ATE and may have curves associated with elements on modern ATE. In any case, bias control circuit 75 may be adjusted to create an equilibrium point 80 on the communication channel of modern ATE to match that of the example legacy ATE.

It is noted that FIG. 5 shows only one way to determine how to program the bias current source. Other ways of programming the bias current source may be used, including, but not limited to, using a mathematical process that is a function of $V_{OH}$, $V_{OL}$, and the load voltage.

There may be an emulation circuit of the type that performs the foregoing functions for each communication channel of an ATE. Each such circuit may be programmed so that its corresponding channel emulates the bias conditions (e.g., voltage and current) of an inactive communication channel of legacy ATE. If the corresponding communication channel is an active channel, then signal source 62 may be programmed accordingly.

The bias control circuitry herein is not limited to use with the hardware and described above. The ATE described herein can be implemented using any hardware including a PMU. Since PMUs typically can force a programmable current, the PMU may offer capabilities required to correct for bias conditions and pin electronics containing a PMU may not require additional bias control circuitry.

The ATE described herein is not limited to use with the hardware and software described above. The ATE described herein can be implemented using any hardware and/or software. For example, the ATE described herein, or portion(s) thereof, can be implemented, at least in part, using digital electronic circuitry, or in computer hardware, firmware, software, or in combinations thereof.

The ATE described herein (e.g., the functions performed by the processing device) can be implemented, at least in part, via a computer program product, i.e., a computer program tangibly embodied in an information carrier, e.g., in a one or more machine-readable media or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Actions associated with implementing the ATE can be performed by one or more programmable processors executing one or more computer programs to perform the functions of the ATE described herein. All or part of the ATE can be implemented as special purpose logic circuitry, e.g., an FPGA (field programmable gate array) and/or an ASIC (application-specific integrated circuit).

Processors suitable for the execution of a computer program include, by way of example, both general and special purpose microprocessors, microcontrollers, and any one or more processors of any kind of digital computer. Generally, a processor will receive instructions and data from a read-only memory or a random access memory or both. Elements of a computer include a processor for executing instructions and one or more memory devices for storing instructions and data.

Elements of different embodiments described herein may be combined to form other embodiments not specifically set forth above. Other embodiments not specifically described herein are also within the scope of the following claims.

What is claimed is:

1. An apparatus for use in testing a device, the apparatus comprising:
a communication channel having a set of programmable parameters associated therewith, the programmable parameters resulting in a bias condition on the communication channel, the communication channel being an inactive communication channel when signals are not actively driven on the communication channel; and
a bias control circuit to adjust the bias condition that results from the programmable parameters in order to emulate a desired bias condition, the desired bias condition corresponding to a bias condition of another inactive communication channel on a different apparatus for using in testing the device.

2. The apparatus of claim 1, further comprising:
a detector to detect signals on the communication channel; and
an active load to subject the communication channel to a loading condition;
wherein the programmable parameters comprise a parameter associated with at least one of the detector and with the active load.

3. The apparatus of claim 2, wherein the programmable parameters comprise at least one of a threshold voltage associated with the detector and a voltage associated with the active load.

4. The apparatus of claim 2, wherein the programmable parameters comprise a bias control current on the communication channel.

5. The apparatus of claim 1, wherein the different apparatus is for executing a test program that depends on the bias conditions.

6. The apparatus of claim 1, wherein the bias control circuit comprises
a current source that is controllable to provide first bias current on the communication channel, the first bias current combining with a second current on the communication channel that is present when the communication channel is inactive.

7. The apparatus of claim 6, wherein a combination of the first and second bias currents corresponds to a bias current that would be produced by test equipment if the test equipment were electrically connected to the communication channel.

8. The apparatus of claim 1, further comprising:
a detector to detect test signals on the communication channel;
a processing device to execute a test program using the test signals;
wherein the test program is configured to expect a voltage from the communication channel when the communication channel is inactive; and
wherein the bias control circuit is configured to affect the voltage.

9. The apparatus of claim 1, wherein the bias control circuit comprises:
a circuit element electrically connected between a voltage source and the communication channel, the circuit element to pass current relative to the voltage source and the communication channel to produce the bias condition.

10. The apparatus of claim 1, wherein bias control circuit comprises a parametric measurement unit (PMU).

11. Automatic test equipment (ATE) for testing a device, the ATE comprising:
communication channels between the ATE and the device;
a processing device to execute a test program to test the device on active communication channels, the test program being configured to expect a first bias condition on an inactive communication channel, the active communication channels having signals actively driven thereon and the inactive communication channel not having signals actively driven thereon; and
a bias controller to produce a second bias condition on the inactive communication channel in order to emulate the first bias condition, the second bias condition on the inactive communication channel being a result of programmable parameters associated with the inactive communication channel.

12. The ATE of claim 11, further comprising:
a detector to detect signals on a communication channel;
wherein the programmable parameters comprise parameters associated with the detector.

13. The ATE of claim 12, further comprising:
an active load to subject the communication channel to a loading condition;
wherein the programmable parameters comprise parameters associated with the active load.

14. The ATE of claim 13, wherein the programmable parameters comprise threshold voltages associated with a detector.

15. The ATE of claim 12, wherein the programmable parameters correspond to a bias control current on the communication channel.

16. The ATE of claim 11, wherein the bias controller comprises:
a programmable current generator to generate a bias current for output to an inactive communication channel, the bias current combining with an existing current on the inactive communication channel to affect the second bias condition.

17. The ATE of claim 11, wherein the bias controller comprises:
a circuit element for use in generating the second bias condition using current on the inactive communication channel.

18. The ATE of claim 11, wherein the bias controller comprises:
a programmable current generator to generate a bias current for output to the inactive communication channel, the bias current combining with an existing current on the inactive communication channel; and
a circuit element for use in adjusting the second bias condition using the bias current and the existing current.

19. The ATE of claim 18, wherein the circuit element has a resistance, wherein a combination of the existing current and the bias current passes through the resistance to produce a first voltage, the second bias condition being based on the first voltage.

20. The ATE of claim 19, further comprising:
a voltage source for providing a second voltage, wherein the second bias condition is based on the first voltage and the second voltage.

21. The ATE of claim 11, wherein the bias controller comprises a parametric measurement unit (PMU).

* * * * *